(12) United States Patent
Nemani et al.

(10) Patent No.: US 9,093,389 B2
(45) Date of Patent: Jul. 28, 2015

(54) METHOD OF PATTERNING A SILICON NITRIDE DIELECTRIC FILM

(71) Applicant: Applied Materials, Inc., Santa Clara, CA (US)

(72) Inventors: Srinivas D. Nemani, Sunnyvale, CA (US); Jeremiah T. Pender, San Jose, CA (US); Qingjun Zhou, San Jose, CA (US); Dmitry Lubomirsky, Cupertino, CA (US); Sergey G. Belostotskiy, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/153,246

(22) Filed: Jan. 13, 2014

(65) Prior Publication Data

US 2014/0199851 A1    Jul. 17, 2014

Related U.S. Application Data

(60) Provisional application No. 61/753,357, filed on Jan. 16, 2013.

(51) Int. Cl.
*H01L 21/311* (2006.01)
*H01L 21/321* (2006.01)

(52) U.S. Cl.
CPC .... *H01L 21/31116* (2013.01); *H01L 21/31111* (2013.01); *H01L 21/32105* (2013.01)

(58) Field of Classification Search
CPC combination set(s) only.
See application file for complete search history.

(56) References Cited

U.S. PATENT DOCUMENTS

| 5,173,151 A * | 12/1992 | Namose | 438/699 |
| 5,910,453 A * | 6/1999 | Gupta et al. | 438/717 |
| 6,168,726 B1 * | 1/2001 | Li et al. | 216/79 |
| 6,852,584 B1 * | 2/2005 | Chen et al. | 438/197 |
| 2004/0021172 A1 * | 2/2004 | Zheng et al. | 257/316 |
| 2005/0202662 A1 * | 9/2005 | Joshi et al. | 438/585 |
| 2006/0057828 A1 | 3/2006 | Omura et al. | |
| 2008/0003836 A1 | 1/2008 | Nishimura et al. | |

FOREIGN PATENT DOCUMENTS

| KR | 1020070111175 | 11/2007 |
| KR | 100808377 | 2/2008 |

OTHER PUBLICATIONS

Plummer et al. Silicon VLSI Technology, 2000, Prentice Hall, pp. 638-639.*
International Search Report and Written Opinion from PCT/US2014/011511 mailed Jun. 23, 2014, 11 pgs.

* cited by examiner

*Primary Examiner* — Duy Deo
*Assistant Examiner* — Erin Bergner
(74) *Attorney, Agent, or Firm* — Blakely Sokoloff Taylor Zafman LLP (57) ABSTRACT

Methods of patterning silicon nitride dielectric films are described. For example, a method of isotropically etching a dielectric film involves partially modifying exposed regions of a silicon nitride layer with an oxygen-based plasma process to provide a modified portion and an unmodified portion of the silicon nitride layer. The method also involves removing, selective to the unmodified portion, the modified portion of the silicon nitride layer with a second plasma process.

19 Claims, 6 Drawing Sheets

METHOD OF PATTERNING A SILICON NITRIDE DIELECTRIC FILM

CROSS-REFERENCE TO RELATED APPLICATIONS

This application claims the benefit of U.S. Provisional Application No. 61/753,357, filed on Jan. 16, 2013, the entire contents of which are hereby incorporated by reference herein.

BACKGROUND

1) Field

Embodiments of the present invention pertain to the field of semiconductor processing and, in particular, to methods of patterning silicon nitride dielectric films.

2) Description of Related Art

In semiconductor manufacturing, silicon nitride is often used as an insulator and chemical barrier in manufacturing integrated circuits, to electrically isolate different structures or as an etch mask in bulk micromachining. As a passivation layer for microchips, it is superior to silicon dioxide, as it is a significantly better diffusion barrier against water molecules and sodium ions, two major sources of corrosion and instability in microelectronics. It is also used as a dielectric between polysilicon layers in capacitors in analog chips.

However, significant improvements are needed in the evolution of silicon nitride dielectric processing technology, such as controlled etching or thinning of such films.

SUMMARY

One or more embodiments described herein are directed to methods of patterning silicon nitride dielectric films.

In an embodiment, a method of isotropically etching a dielectric film involves partially modifying exposed regions of a silicon nitride layer with an oxygen-based plasma process to provide a modified portion and an unmodified portion of the silicon nitride layer. The method also involves removing, selective to the unmodified portion, the modified portion of the silicon nitride layer with a second plasma process.

In another embodiment, a method of isotropically etching a dielectric film involves partially modifying exposed regions of a silicon nitride layer with an oxygen-based plasma process to provide a modified portion and an unmodified portion of the silicon nitride layer. The oxygen-based plasma process is performed by flowing approximately 300 sccm of $O_2$ at a pressure of approximately 200 mT at a temperature of approximately 50 degrees Celsius for a duration of approximately 60 seconds. The method also involves removing the modified portion of the silicon nitride layer with a second plasma process performed by flowing approximately 30 sccm of $NF_3$, approximately 300 sccm of $NH_3$ and approximately 1000 sccm of He at a pressure of approximately 800 mT at a temperature of approximately 50 degrees Celsius for a duration of approximately 120 seconds. The removing is performed selective to the unmodified portion of the silicon nitride layer.

In another embodiment, a method of isotropically etching a dielectric film involves partially modifying exposed regions of a silicon nitride layer with a first oxygen-based plasma process to provide a first modified portion and an unmodified portion of the silicon nitride layer. The first modified portion of the silicon nitride layer is removed with a second plasma process, the removing selective to the unmodified portion. Subsequent to removing the first modified portion, exposed regions of the unmodified portion of the silicon nitride layer are partially modified with a second oxygen-based plasma process to provide a second modified portion of the silicon nitride layer. The second modified portion of the silicon nitride layer is removed with a fourth plasma process.

DETAILED DESCRIPTION

Methods of patterning silicon nitride dielectric films are described. In the following description, numerous specific details are set forth, such as specific plasma treatments and effects for modifying portions of silicon nitride dielectric films, in order to provide a thorough understanding of embodiments of the present invention. It will be apparent to one skilled in the art that embodiments of the present invention may be practiced without these specific details. In other instances, well-known aspects, such as photolithography patterning and development techniques for mask formation, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to approaches for thinning or trimming silicon nitride-based films. The thinning or trimming may be performed, e.g., by isotropic removal of a portion of, or an entire region of, a film composed entirely or substantially of silicon nitride. The thinning or trimming is performed in a controlled manner, as described in greater detail below. As is appreciated in the art, reference to silicon nitride films as described herein can include representations such as "SiN" where the stoichiometric ratio of Si:N is not specified and need not be idealized) or to "$Si_3N_4$" (where the stoichiometric ratio of Si:N is specified and is idealized), with the designation "$SiN_x$" representing both scenarios.

One or more embodiments are directed to isotropic silicon nitride removal. In an embodiment, an RF plasma source is typically used to dissociate a gas, e.g., oxygen gas ($O_2$), in the presence of a substrate or wafer in an etch chamber. In the case of nitride film etching, radicals and ions directly interact with all exposed nitride surfaces altering surface chemical composition. The resulting altered surface film can then be chemically removed in the same chamber with the use of a remote source. In one such embodiment, an $NH_3/NF_3$ based process selective to unmodified nitride and silicon is used for chemical removal. Such a process can be chemically driven so that sputtering damage to remaining layers is minimal or nonexistent. Furthermore, a process in which no residue remains can be achieved, which would otherwise require a wet clean to remove such residue.

More particularly, initial attempts to achieve an isotropic nitride etch involved the use of a high pressure-only dry or plasma etch, e.g., by brute force etching. For comparison purposes, an etched spacer wafer was used to evaluate the extent of the isotropic nature of an etch performed at a pressure of approximately 300 mT. The results showed very little nitride removed, leaving merely an "oxidized" surface.

However, instead, in an embodiment, an $O_2$-based treatment is used to provide a substantially more chemically driven modification of exposed nitride surfaces. The modification is an isotropic modification in that the modification proceeds to a certain depth within the film, regardless of profile. In an exemplary embodiment, the treatment involves flowing approximately 300 sccm of $O_2$, at a lower bias of approximately 10 W and an upper bias of approximately 300 W. A pressure of approximately 200 mT is used at a temperature of approximately 50 degrees Celsius. The sample wafer is electrostatically chucked and Helium (He) used to cool the backside (referred to herein as 10i-o, where an inner band Helium gas flow and outer band Helium gas flow pressure are used to cool a backside of the wafer and is introduced from the chuck), in an inductively coupled (ICP) or Capacitively coupled plasma (CCP) chamber. The treatment is performed for approximately 60 seconds. It is noted that at lower pressures, e.g., pressures of less than approximately 50 mT, the modification becomes anisotropic.

Subsequently, the isotropically modified silicon nitride film can be removed selective to unmodified portions of the film in a Siconi type process, e.g., using a combination of $NF_3$ and $NH_3$ gases. In one such embodiment, the removal process involves flowing approximately 30 sccm of $NF_3$, approximately 300 sccm of $NH_3$, and approximately 1000 sccm of He, at a pressure of approximately 800 mT, at a temperature of approximately 50 degrees Celsius, in the presence of He inert gas backside cooling of an electrostatic chuck, for a duration of approximately 120 seconds. Then, an anneal was performed by flowing approximately 100 sccm of Ar, at a pressure of approximately 5 mT, with a temperature ramp to approximately 110 degrees Celsius, in the presence of He inert gas backside cooling of an electrostatic chuck, for a duration of approximately 120 seconds. Upon performing the modification, the removal, and the anneal, approximately 2 nanometers of silicon nitride was removed from both the etch front and the sidewall of the spacer structure. Accordingly, the removal can be characterized as essentially isotropic. For example, in one embodiment, an etch front/sidewall removal ratio of approximately 1.2:1 is achieved.

Figure 1:
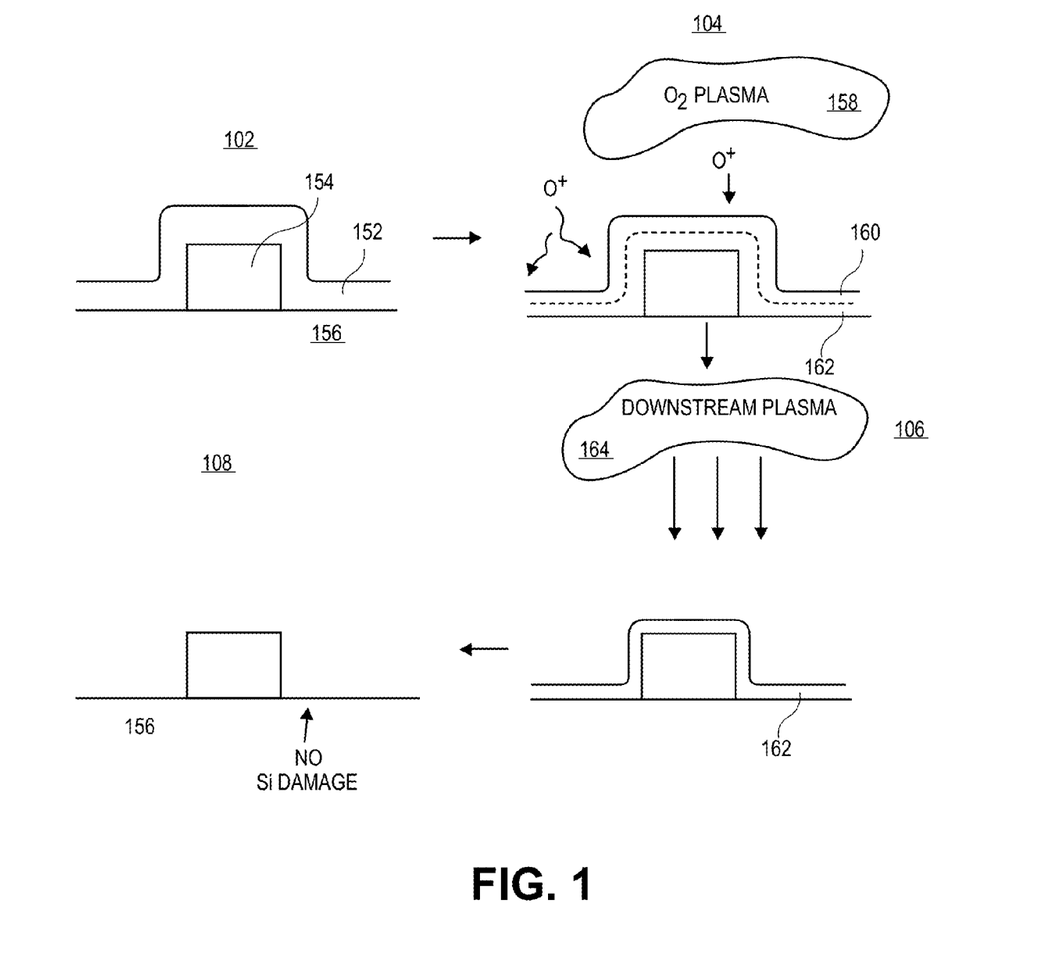
FIG. 1 is a flow diagram of cross-sectional views representing various operations in a method of isotropic etching of a silicon nitride film, in accordance with an embodiment of the present invention.

As a more generalized example, FIG. 1 is a flow diagram of cross-sectional views representing various operations in a method of isotropic etching of a silicon nitride film, in accordance with an embodiment of the present invention. Referring to operation 102, a silicon nitride film 152 is disposed over a structure 154 disposed on a silicon (Si) substrate 156. At operation 104, an oxygen ($O_2$) based plasma 158 is used to modify a portion of the exposed surface of the silicon nitride film 152. In one such embodiment, the modification involves oxidizing a portion of the silicon nitride film 152 with $O^+$ species generated from the plasma 158. The oxidizing generates an oxidized surface portion 160, while deeper portions 162 are not modified. At operation 106, a downstream plasma 164 is used to remove the modified portions 160 of the silicon nitride film 152 selective to remaining portions of unmodified silicon nitride film 162. Optionally, referring to operation 108, the modification and removal may be repeated and may ultimately be used to completely remove a region of the silicon nitride film, leaving structure 154 above substrate 156. The modification and removal process(es) can be performed without damage to the underlying silicon substrate 156, as is depicted at operation 108.

Referring again to FIG. 1, in an embodiment, one or both of the modification and removal etch processes is self-limiting, making the process less susceptible to timing variations so long as a threshold amount of time is met. Use of self-limiting processing can improve uniformity for subsequent processing. Also, although not depicted, in an embodiment, an anneal operation is used between a removal operations and a subsequent cycle of modification and removal etch treatment of the silicon nitride film. The silicon nitride layer that is isotropically etched can be of complete stoichiometry ($Si_3N_4$) or another suitable Si:N stoichiometry, either case represented by $SiN_X$. In one such embodiment, it may be preferable to have silicon-rich silicon nitride film to encourage oxidation of the film during the modification. However, in other embodiment, the silicon nitride film need not be silicon rich.

Referring again to FIG. 1, selectivity at operation 108 was provided such that no damage was afforded to the underlying silicon substrate. More generally, the process described in association with FIG. 1 can be performed selective to, and with no measurable damage to substrates composed of a material suitable to withstand a fabrication process and upon which semiconductor processing layers may suitably reside. In accordance with an embodiment of the present invention, the substrate is composed of a group IV-based material such as, but not limited to, crystalline silicon, germanium or silicon/germanium. In a specific embodiment, the substrate is a monocrystalline silicon substrate. In a particular embodiment, the monocrystalline silicon substrate is doped with impurity atoms. In another embodiment, however, the substrate is composed of a III-V material.

Referring again to FIG. 1, an isotropic etch of the silicon nitride film is achieved even over topographic features, such as the structure depicted between the Si substrate and a portion of the silicon nitride film. For example, the structure may be a gate or gate placeholder structure for use in transistor fabrication. In a particular example, the structure is a polycrystalline silicon or amorphous silicon placeholder structure later used in a replacement gate processing scheme. In another particular embodiment, the structure may ultimately be used to form a floating gate portion of a memory device.

Regardless of the specific technology being fabricated, such an isotropic silicon nitride etch may be used for a variety of situations. For example, in a first embodiment, referring to operation 106 of FIG. 1, an isotropic silicon nitride film etch is used to uniformly thin a silicon nitride layer. In a second embodiment, referring to operation 108 of FIG. 1, an isotropic silicon nitride film etch is used to completely remove a silicon nitride layer from a region of a substrate, without damaging the substrate. In a third embodiment, an isotropic silicon nitride film etch is used to uniformly trim a spacer formed on the sidewall of a structure disposed above a substrate, e.g., to reduce spacer width without substantial reduction in spacer height that is otherwise afforded from an anisotropic etch. In a fourth embodiment, an isotropic silicon nitride film etch is used to trim a hardmask for critical dimension (CD) shrink or adjustment, e.g., by reducing the size of silicon nitride hardmask lines disposed on a polysilicon layer prior to etching the polysilicon layer.

Figure 2:
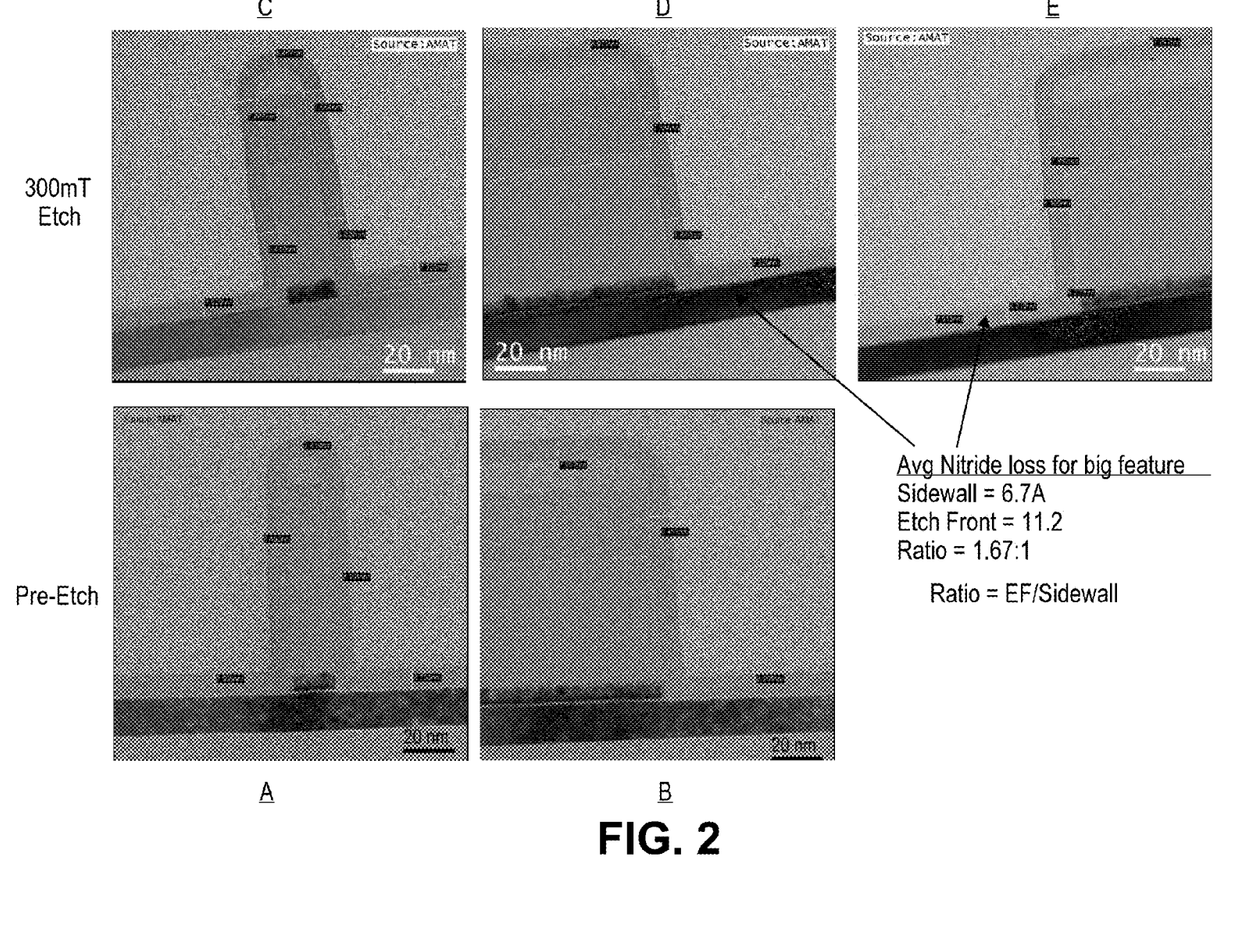
FIG. 2 includes transmission electron microscopy (TEM) images showing a silicon nitride layer pre-etch (images A and B) and post a 300 mTorr $H_2$-based etch (images C, D and E), in accordance with an embodiment of the present invention.

Referring again to the above described initial attempts to achieve an isotropic nitride etch by use of a high pressure-only dry or plasma etch, FIG. 2 includes transmission electron microscopy (TEM) images showing a silicon nitride layer pre-etch (images A and B) and post a 300 mTorr $H_2$-based etch (images C, D and E), in accordance with an embodiment of the present invention. The etch was performed by flowing approximately 400 sccm of $H_2$, at a lower bias of approximately 10 W and an upper bias of approximately 300 W, at a pressure of approximately 300 mT, at a temperature of approximately 50 degrees Celsius, in the presence of He inert gas backside cooling of an electrostatic chuck, for approximately 60 seconds. A Siconi® etch was then performed by flowing approximately 30 sccm of $NF_3$, approximately 300 sccm of $NH_3$, and approximately 1000 sccm of He, at a bias of approximately 600 W, at a pressure of approximately 800 mT, at a temperature of approximately 50 degrees Celsius, in the presence of He inert gas backside cooling of an electrostatic chuck, for a duration of approximately 120 seconds. Then, an anneal was performed by flowing approximately 100 sccm of Ar, at a pressure of approximately 5 mT, with a temperature ramp to approximately 110 degrees Celsius, in the presence of He inert gas backside cooling an of electrostatic chuck, for a duration of approximately 120 seconds. The initial etch, the siconi etch, and the anneal were then repeated for another cycle. Referring to images D and E, the average loss of silicon nitride for a large feature was approximately 6.7 Angstroms at the sidewall, and approximately 11.2 Angstroms at the etch front, for a ratio of 1.67:1, which is somewhat anisotropic, e.g., not suitably isotropic for certain applications.

Figure 3:
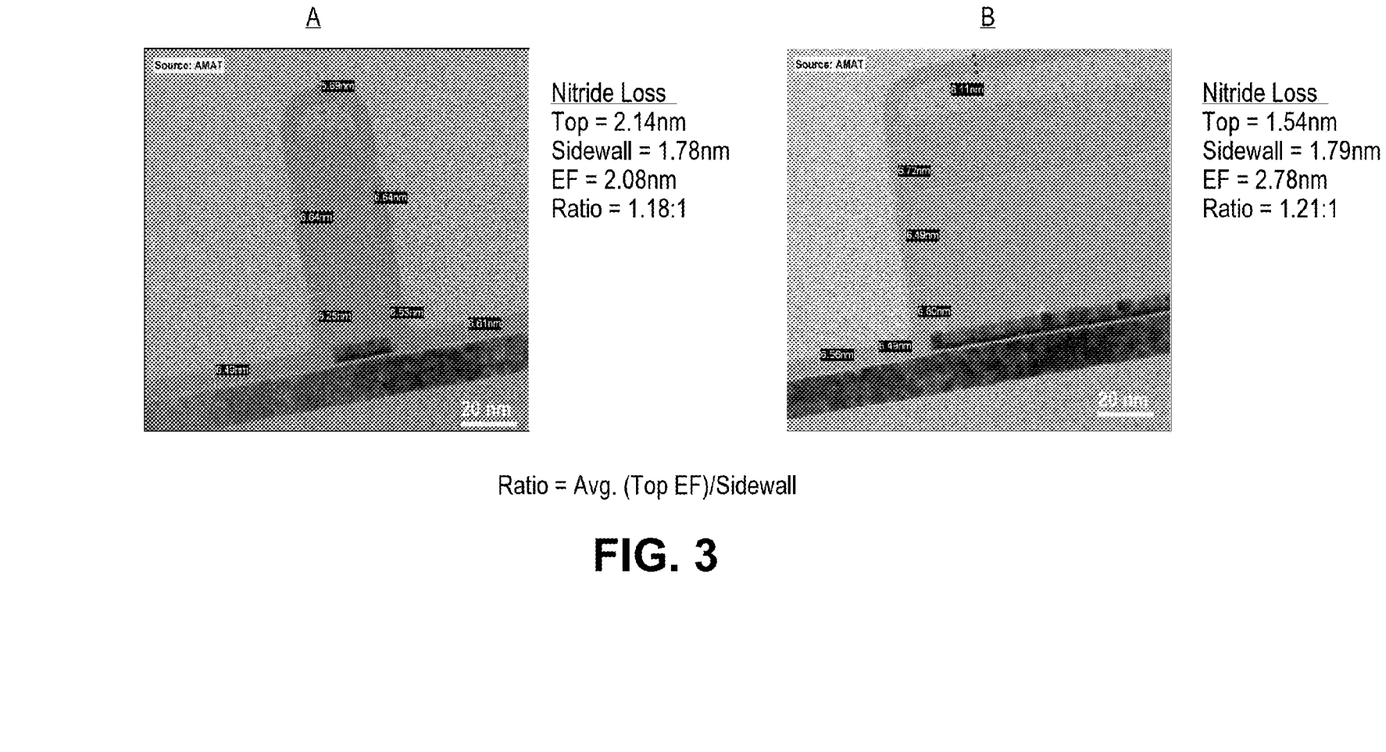
FIG. 3 includes transmission electron microscopy (TEM) images showing $O_2$-based treatment etch results at 200 mTorr for a silicon nitride layer on a small feature (image A) and for a silicon nitride layer on a large feature (image B), in accordance with an embodiment of the present invention.

By contrast to the etch results of FIG. 2, FIG. 3 includes transmission electron microscopy (TEM) images showing $O_2$-based treatment etch results at 200 mT for a silicon nitride layer on a small feature (image A) and for a silicon nitride layer on a large feature (image B), in accordance with an embodiment of the present invention. The etch was performed by flowing approximately 300 sccm of $O_2$, at a lower bias of approximately 10 W and an upper bias of approximately 300 mT, at a pressure of approximately 200 mT, at a temperature of approximately 50 degrees Celsius, in the presence of He inert gas backside cooling of an electrostatic chuck, for approximately 60 seconds. A siconi etch was then performed by flowing approximately 30 sccm of $NF_3$, approximately 300 sccm of $NH_3$, and approximately 1000 sccm of He, at a bias of approximately 600 W, at a pressure of approximately 800 mT, at a temperature of approximately 50 degrees Celsius, in the presence of He inert gas backside cooling of an electrostatic chuck, for a duration of approximately 120 seconds. Then, an anneal was performed by flowing approximately 100 sccm of Ar, at a pressure of approximately 5 mT, with a temperature ramp to approximately 110 degrees Celsius, in the presence of He inert gas backside cooling of an electrostatic chuck, for a duration of approximately 120 seconds. The initial etch, the siconi etch, and the anneal were then repeated for another two cycles, for a total of three cycles. Referring to image A, the average loss of silicon nitride for a small feature was approximately 2.14 nanometers at the top, approximately 1.78 nanometers at the sidewall, and approximately 2.08 nanometers at the etch front (EF), for a ratio of 1.18:1. Referring to image B, the average loss of silicon nitride for a small feature was approximately 1.54 nanometers at the top, approximately 1.79 nanometers at the sidewall, and approximately 2.78 nanometers at the etch front (EF), for a ratio of 1.21:1. The ratios of 1.18:1 and 1.21:1 are substantially isotropic, particularly when compared to the images of FIG. 2. Thus, the use of an $O_2$-based modification, rather than $H_2$, more isotropically alters the film prior to a siconi-type removal.

Figure 4:
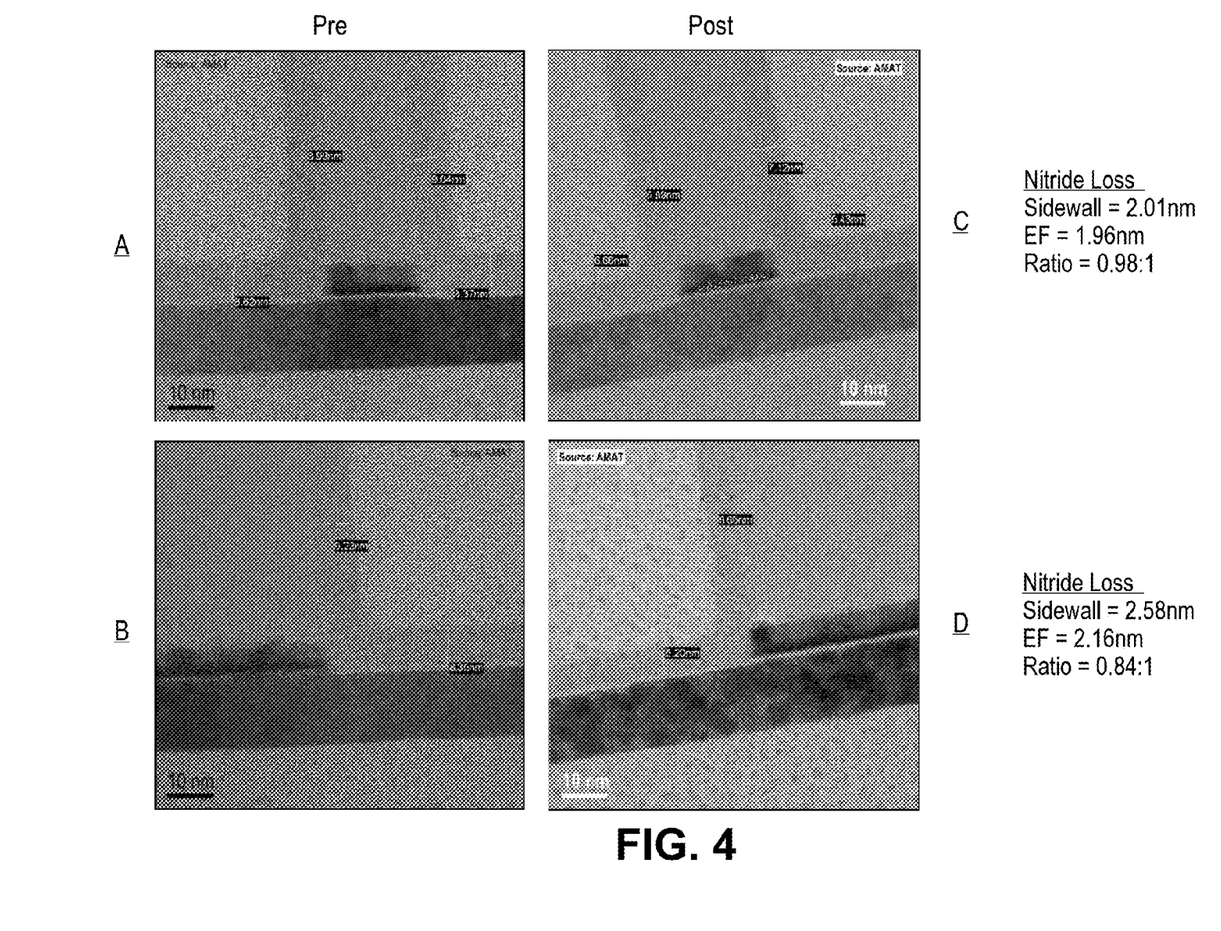
FIG. 4 includes transmission electron microscopy (TEM) images showing $O_2$-based treatment etch results at 300 mT for a silicon nitride layer on a small feature (pre-etch, image A; post-etch, image C) and for a silicon nitride layer on a large feature (pre-etch, image B; post-etch, image D), in accordance with an embodiment of the present invention.

To demonstrate a higher pressure modification approach, FIG. 4 includes transmission electron microscopy (TEM) images showing $O_2$-based treatment etch results at 300 mT for a silicon nitride layer on a small feature (pre-etch, image A; post-etch, image C) and for a silicon nitride layer on a large feature (pre-etch, image B; post-etch, image D), in accordance with an embodiment of the present invention. The etch was performed by flowing approximately 300 sccm of $O_2$, at a lower bias of approximately 10 W and an upper bias of approximately 300 W, at a pressure of approximately 300 mT, at a temperature of approximately 50 degrees Celsius, in the presence of He inert gas backside cooling of an electrostatic chuck, for approximately 60 seconds. A siconi etch was then performed by flowing approximately 30 sccm of $NF_3$, approximately 300 sccm of $NH_3$, and approximately 1000 sccm of He, at a bias of approximately 600 W, at a pressure of approximately 800 mT, at a temperature of approximately 50 degrees Celsius, in the presence of He inert gas backside cooling of an electrostatic chuck, for a duration of approximately 120 seconds. Then, an anneal was performed by flowing approximately 100 sccm of Ar, at a pressure of approximately 5 mT, with a temperature ramp to approximately 110 degrees Celsius, in the presence of He inert gas backside cooling of an electrostatic chuck, for a duration of approximately 120 seconds. The initial etch, the siconi etch, and the anneal were then repeated for another two cycles, for a total of three cycles. Referring to images A and C, the average loss of silicon nitride for a small feature was approximately 2.01 nanometers at the sidewall, and approximately 1.96 nanometers at the etch front (EF), for a ratio of 0.98:1. Referring to images B and D, the average loss of silicon nitride for a small feature was approximately 2.58 nanometers at the sidewall, and approximately 2.16 nanometers at the etch front (EF), for a ratio of 0.84:1. The ratios of 0.98:1 and 0.84:1 are substantially isotropic, particularly when compared to the images of FIG. 2.

Thus, in an embodiment, the removal of an Si—O-containing modification layer such as the modified portion of the silicon nitride layer described above may be performed using a plasma process based on a plasma generated from a gas such as, but not limited to, $NF_3$, ammonia ($NH_3$), or a combination thereof. For example, in a specific such embodiment, a "Siconi" dry etch is used and involves (a) etchant generation in the plasma according to $NF_3+NH_3 \rightarrow NH_4F+NH_4F \cdot HF$, (b) etch process at approximately 30 degrees Celsius according to $NH_4F$ or $NH_4F \cdot HF+SiO_2 \rightarrow (NH_4)_2SiF_6$ (solid)$+H_2O$, and (c) sublimation above approximately 100 degrees Celsius according to $(NH_4)_2SiF_6$ (solid)$\rightarrow SiF_4$ (gas)$+(NH_3)$ (gas)$+$ HF (gas) which is ultimately used to etch the Si—O-containing modification layer. In an alternative embodiment, however, removing the Si—O-containing modification layer includes exposing the silicon nitride film to a vapor such as, but not limited to, hydrogen fluoride (HF) vapor or $NF_4 \cdot HF$ vapor.

The removal of an Si—O-containing modification layer such as the modified portion of the silicon nitride layer described above may be performed in a dedicated chamber. For example, in an embodiment, a siconi chamber includes an anneal region and an etch region for a substrate. An $NH_3$ and $NF_3$ plasma cavity is included for remote plasma generation.

The plasma cavity is coupled with an etchant generation region. In one embodiment, a plasma required for etchant generation is not exposed to the wafer or substrate. The siconi chamber also includes a hot showerhead for uniform etchant delivery and to provide a heat source for annealing. In one embodiment, a cold pedestal is included for cooling the wafer or substrate, for condensing etchant, and/or for controlling selectivity. In one embodiment, a warm chamber wall is included to prevent etchant and by-product condensation. A pumping channel may also be included for uniform pumping and removal of by-products.

In an embodiment, the siconi chamber is used for etchant generation in a remote plasma cavity and silicon oxide reaction, e.g., from a modified silicon nitride film, with a wafer or substrate situated on the cold pedestal. The wafer is raised toward the showerhead and sublimation of by-products is effected by the hot showerhead. Upon removal of the by-products, the wafer or substrate is cleaned. The clean wafer or substrate is then lowered for removal. Thus, in one embodiment, a dry clean process, as carried out at least partially in the siconi chamber, is used to remove a modified portion of a silicon nitride film selective to an unmodified portion of the silicon nitride film.

In an embodiment, one or more of the above processes is performed in a plasma etch chamber. For example, in one embodiment, one or more of the above processes is performed in an Applied Centura® Enabler dielectric etch system, available from Applied Materials of Sunnyvale, Calif., USA. In another embodiment, one or more of the above processes is performed in an Applied Materials™ AdvantEdge G3 etcher, also available from Applied Materials of Sunnyvale, Calif., USA.

Patterning of a silicon nitride dielectric layer may be conducted in processing equipment suitable to provide an etch plasma in proximity to a sample for etching. For example, FIG. 5 illustrates a system in which a method of silicon nitride dielectric film etching is performed, in accordance with an embodiment of the present invention.

Figure 5:
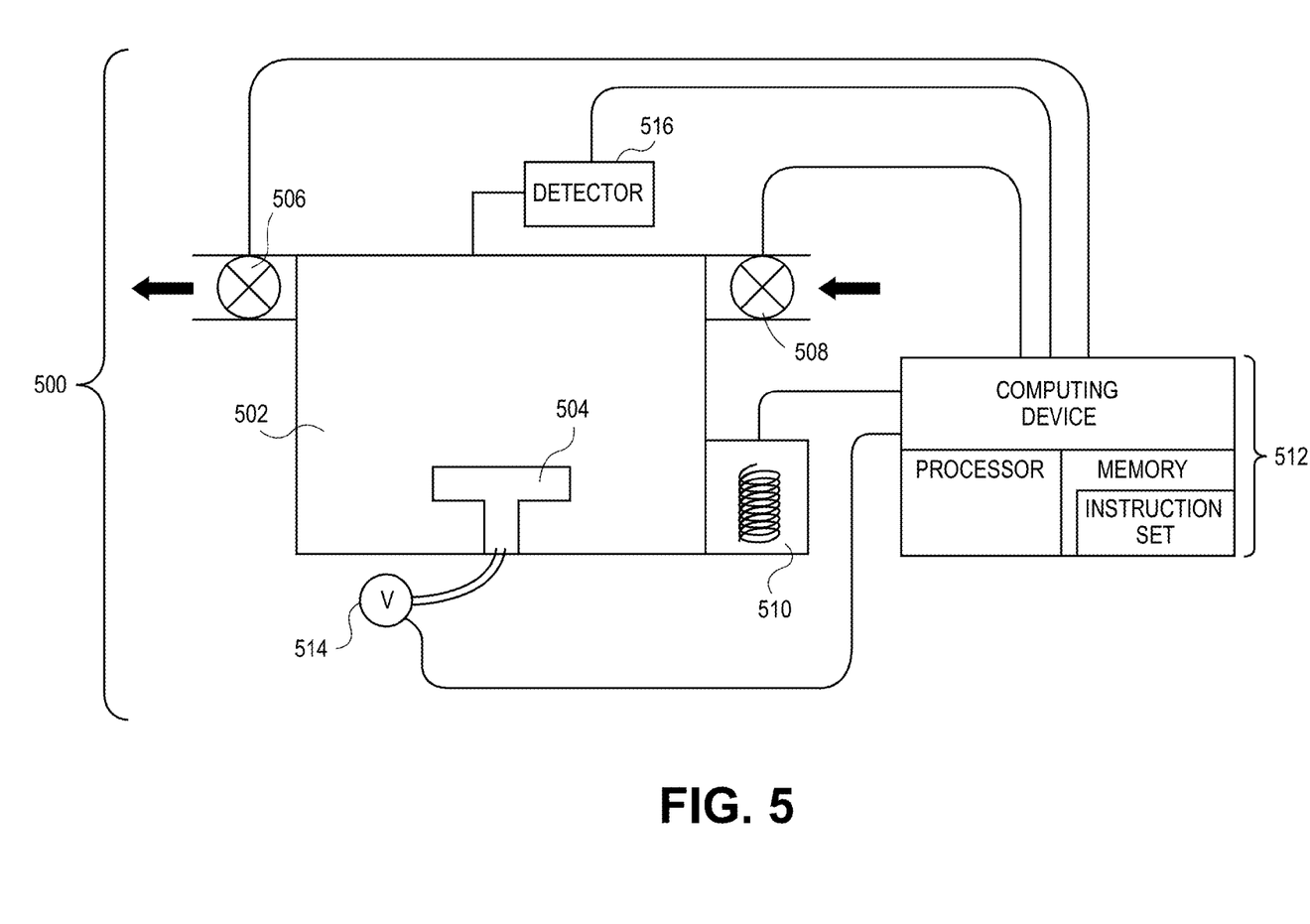
FIG. 5 illustrates a system in which a method of silicon nitride dielectric film etching is performed, in accordance with an embodiment of the present invention.

Referring to FIG. 5, a system 500 for conducting a plasma etch process includes a chamber 502 equipped with a sample holder 504. An evacuation device 506, a gas inlet device 508 and a plasma ignition device 510 are coupled with chamber 502. A computing device 512 is coupled with plasma ignition device 510. System 500 may additionally include a voltage source 514 coupled with sample holder 504 and a detector 516 coupled with chamber 502. Computing device 512 may also be coupled with evacuation device 506, gas inlet device 508, voltage source 514 and detector 516, as depicted in FIG. 5.

Chamber 502 and sample holder 504 may include a reaction chamber and sample positioning device suitable to contain an ionized gas, i.e. a plasma, and bring a sample in proximity to the ionized gas or charged species ejected there from. Evacuation device 506 may be a device suitable to evacuate and de-pressurize chamber 502. Gas inlet device 508 may be a device suitable to inject a reaction gas into chamber 502. Plasma ignition device 510 may be a device suitable for igniting a plasma derived from the reaction gas injected into chamber 502 by gas inlet device 508. Detection device 516 may be a device suitable to detect an end-point of a processing operation. In one embodiment, system 500 includes a chamber 502, a sample holder 504, an evacuation device 506, a gas inlet device 508, a plasma ignition device 510 and a detector 516 similar to, or the same as, those included in an Applied Centura® Enabler dielectric etch system, an Applied Materials™ AdvantEdge G3 system, or an Applied Materials™ C3 dielectric etch chamber.

Embodiments of the present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
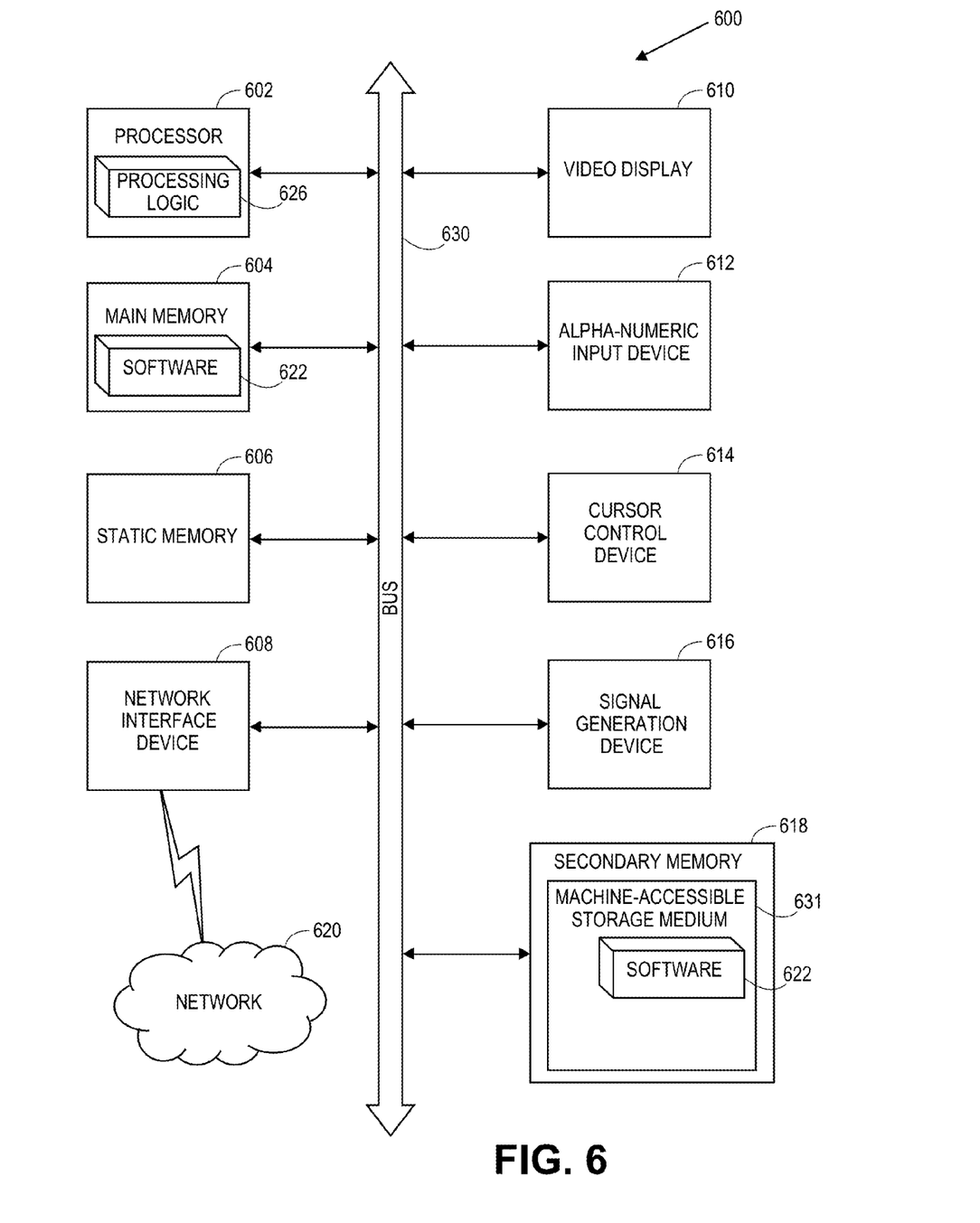
FIG. 6 illustrates a block diagram of an exemplary computer system, in accordance with an embodiment of the present invention.

FIG. 6 illustrates a diagrammatic representation of a machine in the exemplary form of a computer system 600 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In one embodiment, computer system 600 is suitable for use as computing device 512 described in association with FIG. 5.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations discussed herein.

The computer system 600 may further include a network interface device 608. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 631 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of isotropically etching a dielectric film. The method involves partially modifying exposed regions of a silicon nitride layer with an oxygen-based plasma process to provide a modified portion and an unmodified portion of the silicon nitride layer. The method then involves removing, selective to the unmodified portion, the modified portion of the silicon nitride layer with a second plasma process.

In one embodiment, the method further involves, subsequent to the removing, annealing the unmodified portion of the silicon nitride layer. In one embodiment, the method further involves, subsequent to the removing, partially modifying exposed regions of the silicon nitride layer with a second oxygen-based plasma process to provide a second modified portion and a second unmodified portion of the silicon nitride layer; and removing, selective to the second unmodified portion, the second modified portion of the silicon nitride layer with a plasma process. In one embodiment, the modifying involves oxidizing a portion of the silicon nitride layer with $O^+$ species. In one embodiment, the removing is performed selective to an underlying silicon substrate. In one embodiment, one or both of the modifying and the removing is a self-limiting process. In one embodiment, the second plasma process is based on a combination of $NF_3$ and $NH_3$. In one embodiment, the removing isotropically thins the silicon nitride layer. In one embodiment, the removing reduces a spacer width of a silicon nitride based spacer. In one embodiment, the removing trims a silicon nitride hardmask for critical dimension (CD) shrink or adjustment.

Thus, methods of patterning silicon nitride dielectric films have been disclosed.

What is claimed is:

1. A method of isotropically etching a dielectric film, the method comprising:
   isotropically partially modifying a continuous and non-masked silicon nitride layer with an oxygen-based plasma process to provide a modified portion and an unmodified portion of the continuous and non-masked silicon nitride layer, the continuous and non-masked silicon nitride layer conformal with an underlying non-planar topography and having the underlying non-planar topography; and
   removing the modified portion of the continuous and non-masked silicon nitride layer with a second, different, plasma process selective to and without removing the unmodified portion of the continuous and non-masked silicon nitride layer.

2. The method of claim 1, further comprising:
   subsequent to the removing, annealing the unmodified portion of the continuous and non-masked silicon nitride layer.

3. The method of claim 1, further comprising:
   subsequent to the removing, isotropically partially modifying the unmodified portion of the continuous and non-masked silicon nitride layer with a second oxygen-based plasma process to provide a second modified portion and a second unmodified portion of the continuous and non-masked silicon nitride layer; and
   removing, selective to the second unmodified portion, the second modified portion of the continuous and non-masked silicon nitride layer with a plasma process.

4. The method of claim 1, wherein the modifying comprises oxidizing a portion of the silicon nitride layer with $O^+$ species.

5. The method of claim 1, wherein the removing is performed selective to an underlying silicon substrate.

6. The method of claim 1, wherein one or both of the modifying and the removing is a self-limiting process.

7. The method of claim 1, wherein the second plasma process is based on a combination of $NF_3$ and $NH_3$.

8. The method of claim 1, wherein the removing isotropically thins the continuous and non-masked silicon nitride layer.

9. The method of claim 1, wherein the removing reduces a spacer width of a silicon nitride based spacer.

10. A method of isotropically etching a dielectric film, the method comprising:
    isotropically partially modifying a continuous and non-masked silicon nitride layer with an oxygen-based plasma process to provide a modified portion and an unmodified portion of the continuous and non-masked silicon nitride layer, the oxygen-based plasma process performed by flowing approximately 300 sccm of $O_2$ at a pressure of approximately 200 mT at a temperature of approximately 50 degrees Celsius for a duration of approximately 60 seconds, and the continuous and non-masked silicon nitride layer conformal with an underlying non-planar topography and having the underlying non-planar topography; and
    removing the modified portion of the continuous and non-masked silicon nitride layer with a second plasma process performed by flowing approximately 30 sccm of $NF_3$, approximately 300 sccm of $NH_3$ and approximately 1000 sccm of He at a pressure of approximately 800 mT at a temperature of approximately 50 degrees Celsius for a duration of approximately 120 seconds, the removing performed selective to the unmodified portion of the continuous and non-masked silicon nitride layer.

11. The method of claim 10, further comprising:
    subsequent to the removing, annealing the unmodified portion of the continuous and non-masked silicon nitride layer, the annealing performed by flowing approximately 100 sccm of Ar at a pressure of approximately 5 mT, with a temperature ramp to approximately 110 degrees Celsius, for a duration of approximately 120 seconds.

12. The method of claim 10, wherein the oxygen-based plasma process is performed in an inductively coupled plasma (ICP) chamber or capacitively coupled plasma (CCP) chamber, and wherein the oxygen-based plasma process is performed at a lower chamber bias of approximately 10 W and an upper chamber bias of approximately 300 W.

13. The method of claim 10, wherein the modifying comprises oxidizing a portion of the continuous and non-masked silicon nitride layer with $O^+$ species.

14. The method of claim 10, wherein one or both of the modifying and the removing is a self-limiting process.

15. The method of claim 10, wherein the removing isotropically thins the continuous and non-masked silicon nitride layer.

16. A method of isotropically etching a dielectric film, the method comprising:
   isotropically partially modifying a continuous and non-masked silicon nitride layer with a first oxygen-based plasma process to provide a first modified portion and an unmodified portion of the continuous and non-masked silicon nitride layer, the continuous and non-masked silicon nitride layer conformal with an underlying non-planar topography and having the underlying non-planar topography;
   removing the first modified portion of the continuous and non-masked silicon nitride layer with a second, different, plasma process, the removing selective to the unmodified portion;
   subsequent to removing the first modified portion, isotropically partially modifying the unmodified portion of the continuous and non-masked silicon nitride layer with a second oxygen-based plasma process to provide a second modified portion of the continuous and non-masked silicon nitride layer; and
   removing the second modified portion of the continuous and non-masked silicon nitride layer with a fourth plasma process.

17. The method of claim 16, further comprising:
   subsequent to removing the first modified portion of the continuous and non-masked silicon nitride layer, annealing the unmodified portion of the continuous and non-masked silicon nitride layer.

18. The method of claim 16, wherein forming the first and second modified portions of the continuous and non-masked silicon nitride layer comprises oxidizing with $O^+$ species.

19. The method of claim 16, wherein the second and fourth plasma processes are each based on a combination of $NF_3$ and $NH_3$.

* * * * *